US009947668B2

(12) United States Patent
Lee et al.

(10) Patent No.: US 9,947,668 B2
(45) Date of Patent: Apr. 17, 2018

(54) SEMICONDUCTOR DEVICES AND METHODS OF FORMING THE SAME

(71) Applicant: Samsung Electronics Co., Ltd., Suwon-Si, Gyeonggi-Do (KR)

(72) Inventors: Dongjin Lee, Seoul (KR); Sungho Jang, Seoul (KR); Jiyoung Kim, Yongin-si (KR); Kang-Uk Kim, Seoul (KR); Chan Min Lee, Hwaseong-si (KR); Juyeon Jang, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 388 days.

(21) Appl. No.: 14/591,165

(22) Filed: Jan. 7, 2015

(65) Prior Publication Data

US 2015/0303201 A1 Oct. 22, 2015

(30) Foreign Application Priority Data

Apr. 21, 2014 (KR) ........................ 10-2014-0047449

(51) Int. Cl.
H01L 27/108 (2006.01)
H01L 21/3213 (2006.01)

(52) U.S. Cl.
CPC .. *H01L 27/10885* (2013.01); *H01L 21/32139* (2013.01); *H01L 27/10888* (2013.01); *H01L 27/10894* (2013.01); *H01L 27/10897* (2013.01); *H01L 21/32134* (2013.01); *H01L 21/32135* (2013.01)

(58) Field of Classification Search
CPC ............................................. H01L 27/10885
See application file for complete search history.

(56) References Cited

U.S. PATENT DOCUMENTS

| 6,417,104 | B1 | 7/2002 | Hu |
|---|---|---|---|
| 7,034,408 | B1 | 4/2006 | Schloesser |
| 7,989,902 | B2 | 8/2011 | Ando et al. |
| 8,461,687 | B2 | 6/2013 | Cho et al. |
| 2007/0178681 | A1 | 8/2007 | Chung et al. |
| 2010/0320547 | A1 | 12/2010 | Ando et al. |
| 2011/0241102 | A1 | 10/2011 | Cho et al. |
| 2011/0263089 | A1 | 10/2011 | Park |
| 2012/0045876 | A1 | 2/2012 | Kawahara et al. |
| 2012/0086084 | A1 | 4/2012 | Kikuchi |
| 2012/0319206 | A1 | 12/2012 | Bidal et al. |
| 2013/0026546 | A1 | 1/2013 | Favennec et al. |

FOREIGN PATENT DOCUMENTS

| JP | 2009-170762 A | 7/2009 |
|---|---|---|
| KR | 10-2013-0048624 A | 5/2013 |

*Primary Examiner* — John P Dulka
(74) *Attorney, Agent, or Firm* — Harness, Dickey & Pierce, P.L.C.

(57) ABSTRACT

Semiconductor devices, and methods for forming the same, include forming a first wiring film and an etching buffer film in a cell array region and a peripheral circuit region of a substrate, and forming a contact hole by selectively etching the etching buffer film and the first wiring film so as to expose an active region of the cell array region and at least a part of a field isolation region adjacent thereto. A bit line contact is formed in the contact hole to be in contact with the active region, and a second wiring film is formed over the substrate. By patterning the second wiring film, the bit line contact, the etching buffer film, and the first wiring film, a bit line is formed in the cell array region and a peripheral gate is formed in the peripheral circuit region.

12 Claims, 18 Drawing Sheets

SEMICONDUCTOR DEVICES AND METHODS OF FORMING THE SAME

CROSS-REFERENCE TO RELATED APPLICATIONS

This application claims the benefit of priority under 35 U.S.C. § 119 to Korean Patent Application No. 10-2014-0047449, filed on Apr. 21, 2014, in the Korean Intellectual Property Office, the content of which is incorporated herein by reference in its entirety.

BACKGROUND

Field

Example embodiments relate to semiconductor devices, and methods of forming a semiconductor device, and/or more particularly, to semiconductor devices and methods of forming a semiconductor device by simultaneously patterning a cell array region and a peripheral circuit region.

Related Art

Recently, as a semiconductor device has a higher level of integration, it is becoming increasingly difficult to simultaneously pattern a bit line in a cell array region and a peripheral gate in a peripheral circuit region. A pitting phenomenon may occur in an active region of the peripheral circuit region due to a difference in an etching amount between respective films for forming the bit line and the peripheral gate. If a thickness of the film for forming the peripheral gate is increased to prevent the pitting phenomenon, then a parasitic capacitance may increase.

SUMMARY

Some example embodiments provide semiconductor devices having enhanced reliability and/or methods of forming a semiconductor device by simultaneously patterning a cell array region and a peripheral circuit region.

According to some example embodiments, there is provided a method of forming a semiconductor device including preparing a substrate which includes a cell array region having a first active region and a peripheral circuit region having a second active region, wherein the first and second active regions may be delimited by a field isolation region, and the first active region may include a first source/drain region and second source/drain regions disposed therein at both sides of the first source/drain region; forming a first wiring film and an etching buffer film in the cell array region and the peripheral circuit region; forming a contact hole by patterning the etching buffer film and the first wiring film to partially expose the first source/drain region and the field isolation region adjacent to the first source/drain region; forming a bit line contact in the contact hole so as to be in contact with the first source/drain region; forming a second wiring film over the substrate; and forming a bit line in the cell array region and a peripheral gate in the peripheral circuit region by patterning the second wiring film, the etching buffer film, and the first wiring film, wherein the forming a bit line includes patterning the second wiring film and the bit line contact on the first source/drain region in the cell region, and the forming a peripheral gate includes patterning the second wiring film to at least partially expose the etching buffer film in the peripheral circuit region.

The forming a bit line may further include patterning the second wiring film to partially expose the etching buffer film in the cell array region.

The patterning the second wiring film and the bit line contact on the first source/drain region in the cell array region may further include at least partially exposing the contact hole so as to expose a part of side walls of at least one selected from the etching buffer film, the first wiring film, and a combination thereof.

The forming a bit line in the cell array region and the peripheral gate in the peripheral circuit region may further include partially exposing an adjacent field isolation region by additionally patterning the bit line contact on the first source/drain region in the cell array region, and patterning the exposed etching buffer film and the first wiring film in the cell array region and the peripheral circuit region The first wiring film may comprise a semiconductor film, and the forming a second wiring film may comprise forming at least one of an ohmic barrier film, a metal silicide film, a metal film and combinations thereof. The ohmic barrier film may comprise at least one selected from a titanium silicon nitride, a tungsten silicon nitride, a tantalum silicon nitride, a titanium silicide, and combinations thereof.

The etching buffer film may include a lanthanum film, a lanthanum oxide, or a combination thereof.

According to other example embodiments, there is provided a method of forming a semiconductor device including preparing a substrate including a cell array region having an active region and a peripheral circuit region; forming a first wiring film and an etching buffer film in the cell array region and the peripheral circuit region; forming a bit line contact so as to be in contact with the active region by passing through the etching buffer film and the first wiring film; forming a second wiring film on the etching buffer film and the bit line contact; and forming a bit line in the cell array region and a peripheral gate in the peripheral circuit region by patterning the second wiring film, the bit line contact, the etching buffer film, and the first wiring film. The patterning the second wiring film and the bit line contact may be performed so as to prevent the first wiring film from being etched by the etching buffer film.

According to still other example embodiments, there is provided a semiconductor device including a substrate which includes a cell array region having a first active region delimited by a field isolation region, and a peripheral circuit region having a second active region, the first active region including a first source/drain region and second source/drain regions at opposing sides of the first source/drain region; a bit line crossing the first active region in the cell array region and including a first lower wiring pattern, a first etching buffer pattern, and a first upper wiring pattern; and a peripheral gate including a second lower wiring pattern, a second etching buffer pattern, and a second upper wiring pattern in the peripheral circuit region, wherein the bit line further includes a bit line contact extending through a contact hole in the first lower wiring pattern and the first etching buffer pattern exposing the first source/drain region.

An upper surface of the bit line contact may be at a substantially same height as an upper surface of the etching buffer pattern.

The respective first and second upper wiring patterns may include at least one selected from an ohmic barrier pattern, a metal silicide pattern, a metal pattern and combinations thereof.

The ohmic barrier pattern may be in contact with the bit line contact and the etching buffer pattern.

The etching buffer pattern may comprise a lanthanum, a lanthanum oxide, or a combination thereof.

The respective first and second lower wiring patterns may comprise silicon, and the ohmic barrier pattern may comprise at least one selected from a titanium silicon nitride, a tungsten silicon nitride, a tantalum silicon nitride, a titanium silicide, and combinations thereof.

A lower surface of the bit line contact may be lower than an upper surface of the substrate.

The contact hole may partially expose the field isolation region adjacent to the first source/drain region.

The semiconductor device may further include a bit line spacer which covers side walls of the bit line and at least a part of the exposed field isolation region.

Further example embodiments provide a method of forming a semiconductor device, including providing a substrate having a peripheral circuit region and a cell array region, the cell array region having a source/drain region; forming a lower wiring structure and an etching buffer structure over the peripheral circuit region and the cell array region; forming a bit line contact extending through the etching buffer structure and the lower wiring structure to the source/drain region; forming an upper wiring structure over the peripheral circuit region and the bit line contact; and forming a bit line in the cell array region and a peripheral gate in the peripheral circuit region by simultaneously patterning the upper wiring structure, the bit line contact, the etching buffer structure, and the lower wiring structure.

The forming the upper wiring structure over the peripheral circuit region and the bit line contact may include partially exposing the etching buffer structure in the peripheral region and the cell array region.

The method may include forming an ohmic barrier pattern over the peripheral region and the cell array region using the etching buffer structure as an etch buffer, prior to the forming a bit line.

The etching buffer structure may have at least one selected from (i) a higher etching selectivity and (ii) a smaller thickness than the ohmic barrier pattern.

The etching buffer structure may be formed of at least one lanthanoid, and the ohmic barrier pattern may be formed of at least one metal silicide.

BRIEF DESCRIPTION OF THE DRAWINGS

Example embodiments will be more clearly understood from the following detailed description taken in conjunction with the accompanying drawings. FIGS. 1-9 represent non-limiting, example embodiments as described herein.

FIG. 1 illustrates a plan view of a semiconductor device according to some example embodiments.

FIG. 2A illustrates a cross-sectional view taken along a line I-I' of FIG. 1, FIG. 2B illustrates a cross-sectional view taken along a line II-II' of FIG. 1, and FIG. 2C illustrates a cross-sectional view taken along a line III-III' of FIG. 1.

FIGS. 3A to 7C illustrate cross-sectional views of sequential processes in manufacturing methods of semiconductor devices according to other example embodiments, FIGS. 3A to 7A illustrate cross-sectional views taken along a line I-I' of FIG. 1, FIGS. 3B to 7B illustrate cross-sectional views taken along a line II-II' of FIG. 1, and FIGS. 3C to 7C illustrate cross-sectional views taken along a line III-III' of FIG. 1.

FIG. 8 illustrates a schematic block diagram of electronic devices including semiconductor devices according to yet other example embodiments.

FIG. 9 illustrates a schematic block diagram of memory systems including semiconductor devices according to further example embodiments.

DETAILED DESCRIPTION OF EXAMPLE EMBODIMENTS

Figure 1:
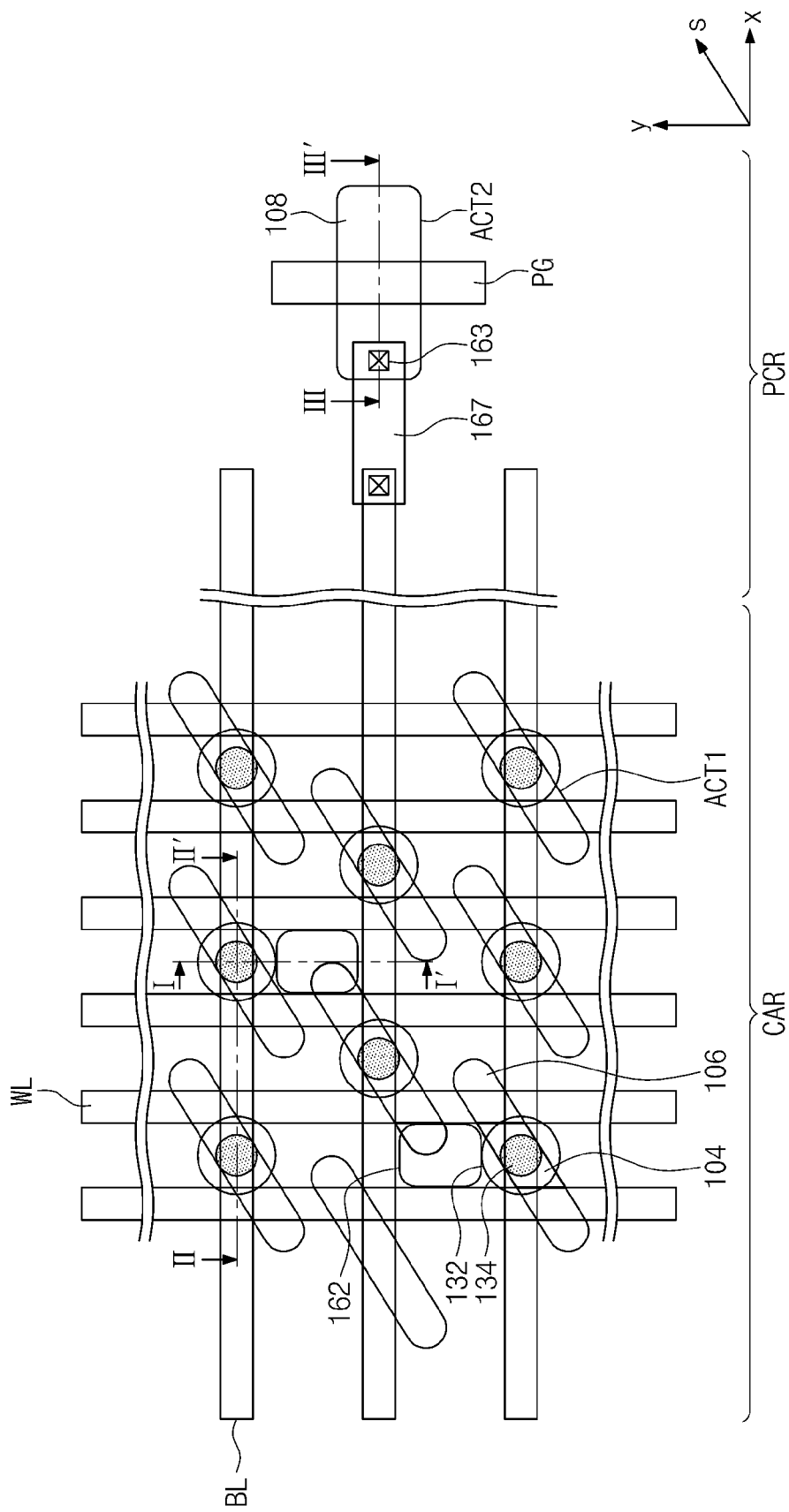

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various features will be described in detail with reference to the attached drawings. However, example embodiments described are not limited thereto.

Some example embodiments provide semiconductor devices having enhanced reliability and/or methods of forming a semiconductor device by simultaneously patterning a cell array region and a peripheral circuit region. FIG. 1 illustrates a plan view of a semiconductor device according to some example embodiments.

Figure 2A:
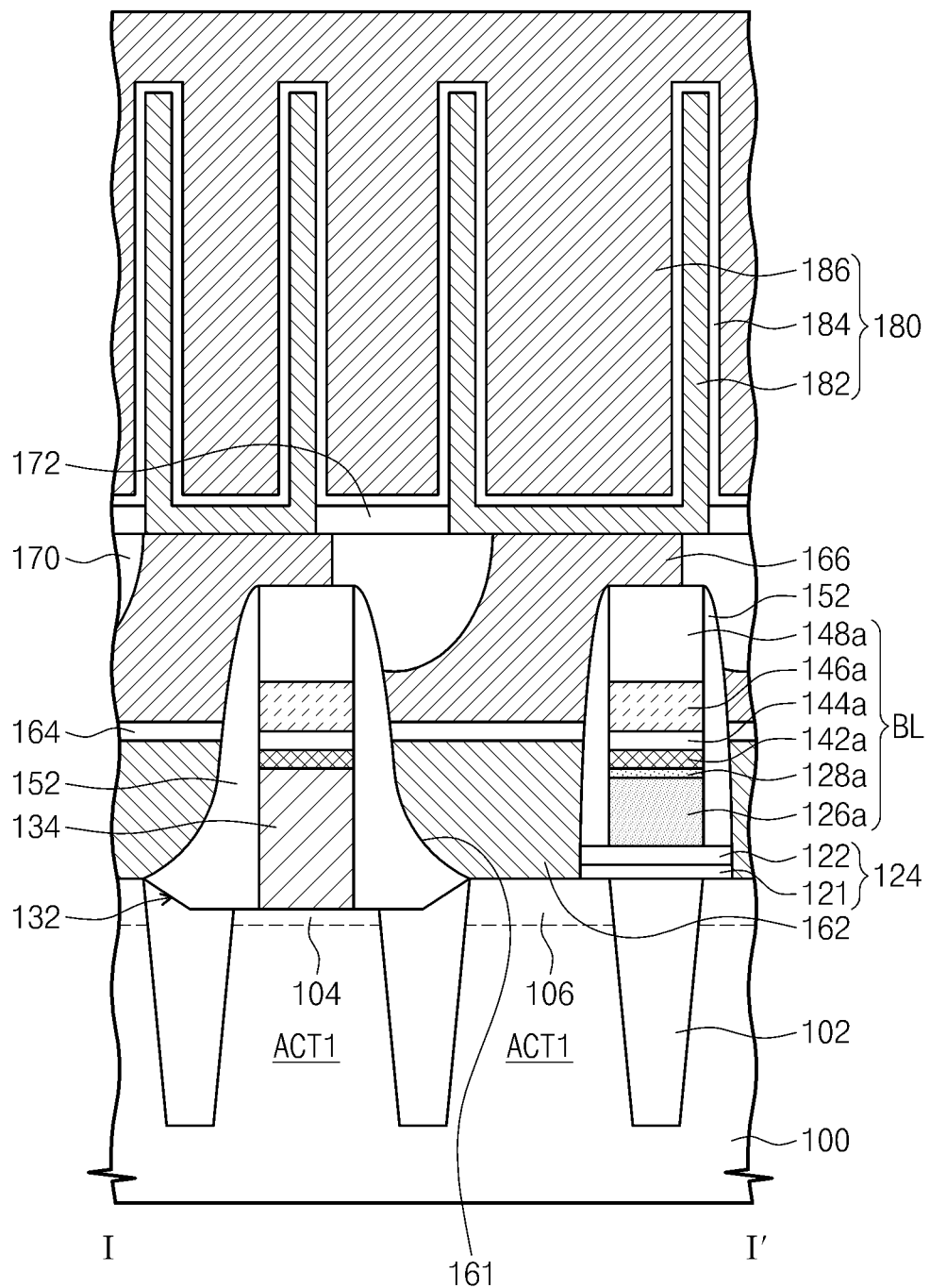
FIGS. 2A to 2C illustrate views of essential parts of the semiconductor device according to example embodiments shown in FIG. 1.
Figure 2B:
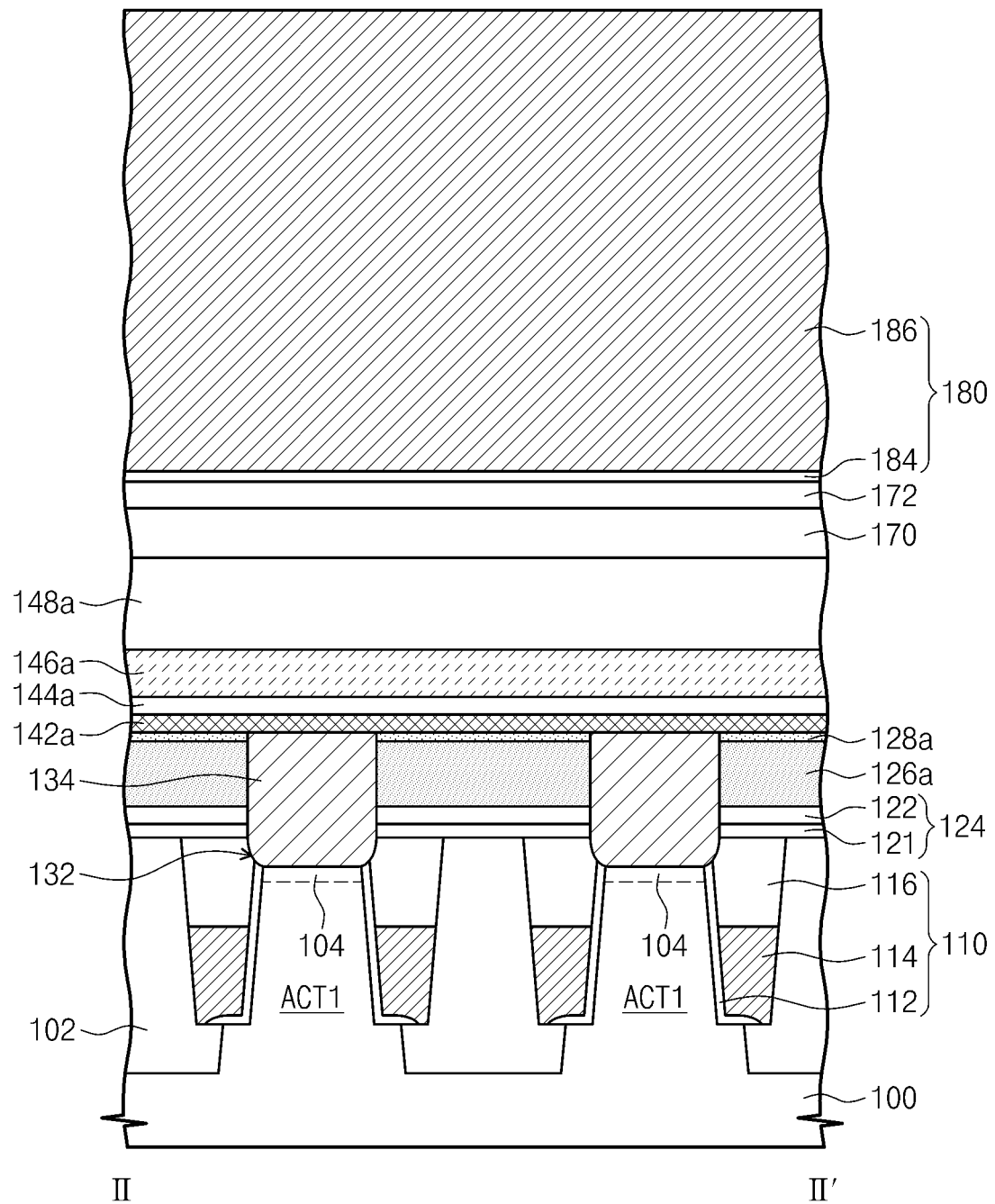
Figure 2C:
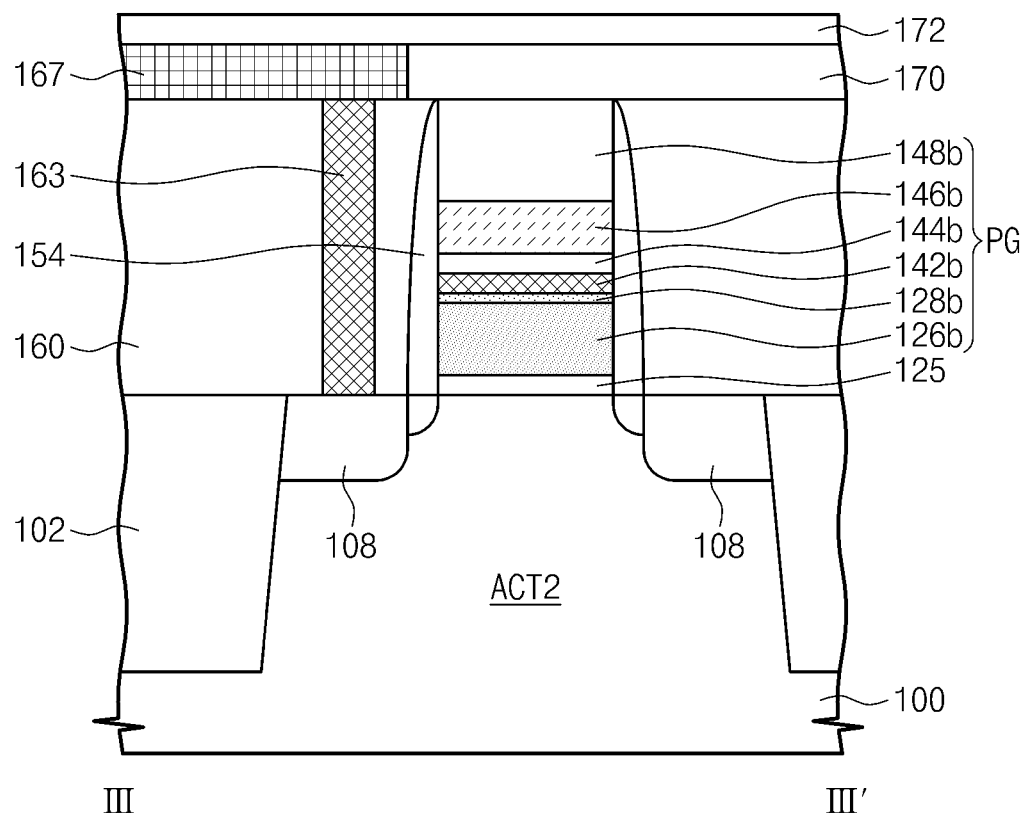
Figure 3A:
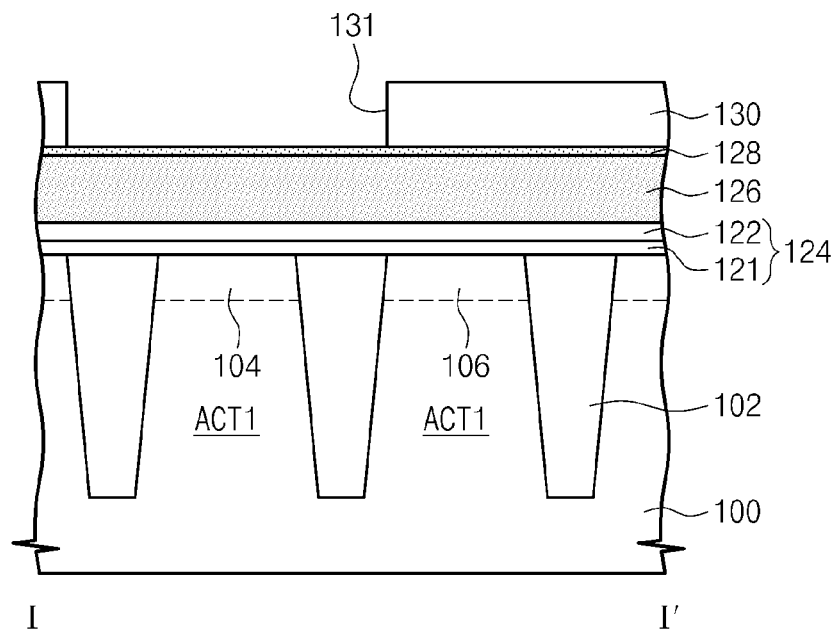
Figure 3B:
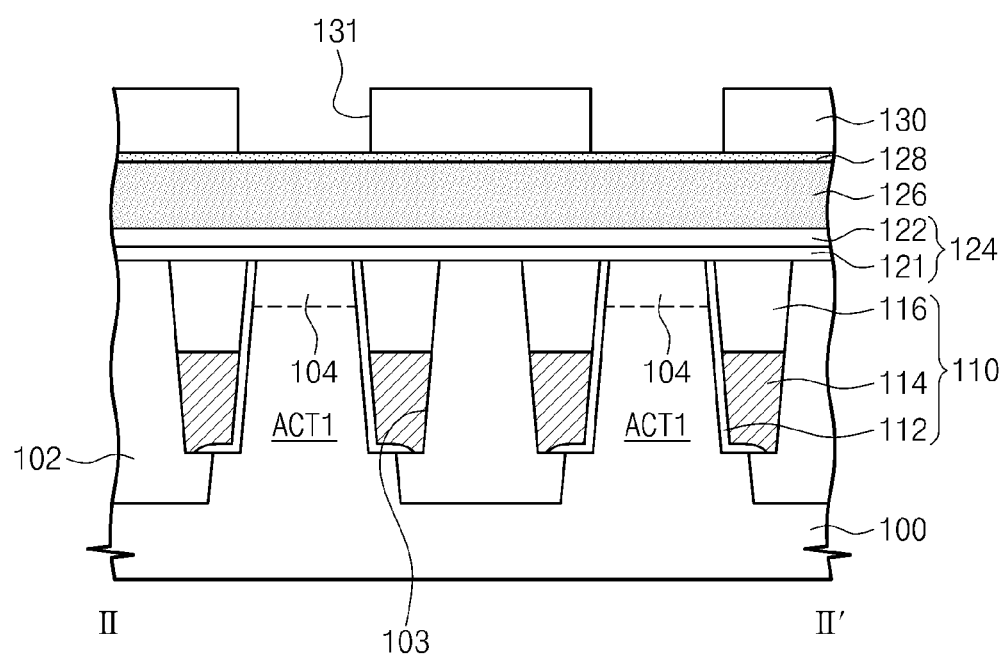
Figure 3C:
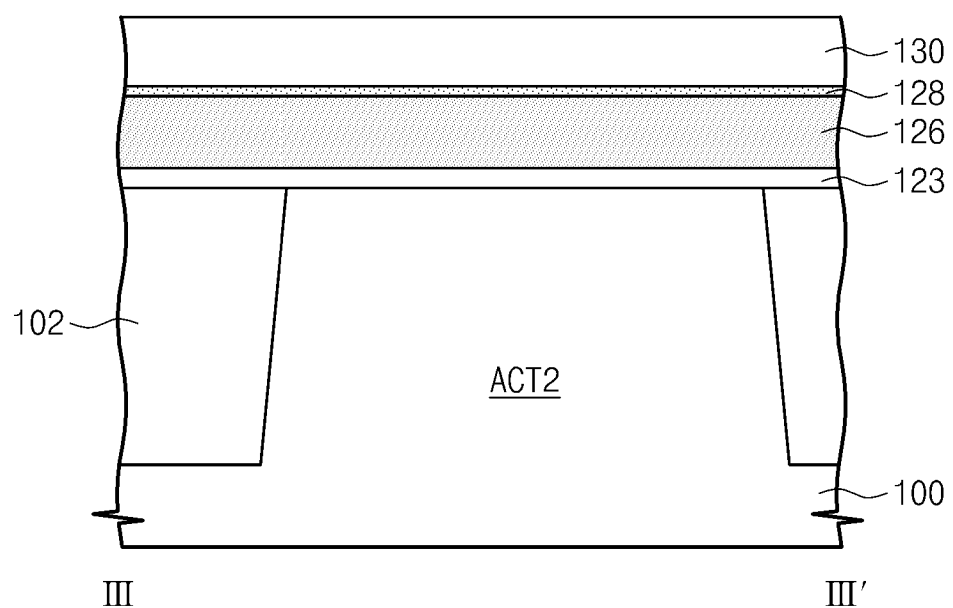

FIGS. 2A to 2C illustrate views of essential parts of the semiconductor device according to the example embodiments shown in FIG. 1. FIG. 2A illustrates a cross-sectional view taken along a line I-I' of FIG. 1, FIG. 2B illustrates a cross-sectional view taken along a line II-II' of FIG. 1, and FIG. 2C illustrates a cross-sectional view taken along a line III-III' of FIG. 1.

The semiconductor device according to some example embodiments will be now described with reference to FIGS. 1, 2A, 2B, and 2C.

A substrate 100 which includes a cell array region CAR and a peripheral circuit region PCR may be prepared. The cell array region CAR may be a region in which a plurality of memory cells are arranged, and the peripheral circuit region PCR may be a region which is arranged by word line drivers, sense amplifiers, row and column decoders, and control circuits.

A field isolation region 102 may be formed in the substrate 100 to delimit first active regions ACT1 in the cell array region CAR and a second active region ACT2 in the peripheral circuit region PCR. The substrate 100 may be a semiconductor substrate formed of, for example, silicon, germanium, and/or a silicon-germanium. The first active regions ACT1 may be bar-shaped (i.e., rectangular) spaced apart from each other in a plan view. In FIG. 1, an x-axis direction may correspond to a first direction, and a y-axis direction may correspond to a second direction. Each of the first active regions ACT1 may extend in a third direction, i.e., s-axis direction non-perpendicular (or oblique) to both of the first and second directions in a plan view. Hereinafter, the first direction is referred to as the x-axis direction, the second direction is referred to as the y-axis direction, and the third direction is referred to as the s-axis direction. The x-axis direction and the y-axis direction may cross with each other.

At least two word lines WL may be arranged to cross the first active regions ACT1 and extend in the second direction in the cell array region CAR. Each of the word lines WL may comprise a cell gate structure 110. The cell gate structure 110 may include a cell gate insulation film 112, a cell gate conductive pattern 114, and a cell gate capping pattern 116.

A first source/drain region 104 may be disposed at the center of the first active regions ACT1 between the word lines WL. Second source/drain regions 106 may be disposed at the edges of the first active regions ACT1 at opposite sides of the first source/drain region 104. The first source/drain region 104 and the second source/drain regions 106 may have a different conductivity type from that of the substrate 100

A plurality of bit lines BL may be arranged to extend in the first direction in the cell array region CAR in which a cell blocking film 124 is disposed. Each of the bit lines BL may comprise a first lower wiring pattern 126a, a first etching buffer pattern 128a, a first ohmic barrier pattern 142a, a first upper wiring pattern 144a, a first conductive capping pattern 146a, and a first insulation capping pattern 148a sequentially stacked one on another.

Each of the bit lines BL may be electrically in contact with the first source/drain region 104 of the first active regions ACT1 through a bit line contact 134. The bit line contact 134 may pass through the cell blocking film 124, the first lower wiring pattern 126a, and the first etching buffer pattern 128a. An upper surface of the bit line contact 134 may be in contact with the first ohmic barrier pattern 142a, and a lower surface of the bit line contact 134 may be in contact with the first source/drain region 104. Side surfaces of the bit line contact 134 may be in contact with the first lower wiring pattern 126a and the first etching buffer pattern 128a. The lower surface of the bit line contact 134 may be lower than an upper surface of the substrate 100. The upper surface of the bit line contact 134 may be disposed at substantially the same height as an upper surface of the first etching buffer pattern 128a from the substrate 100. The first ohmic barrier pattern 142a may be in contact with not only the bit line contact 134 but also the first etching buffer pattern 128a. The bit line contact 134 may include a doped semiconductor film, for example, a doped silicon film.

The cell blocking film 124 may comprise a first cell blocking film 121 and a second cell blocking film 122. The first cell blocking film 121 may comprise at least one of a silicon nitride, a silicon oxide, a silicon oxynitride, and combinations thereof. The second cell blocking film 122 may comprise at least one of a silicon nitride, a silicon oxide, a silicon oxynitride, and combinations thereof.

A bit line spacer 152 may be disposed on sidewalls of the bit lines BL. In some example embodiments, the bit line spacer 152 may include an air space disposed therein.

A first interlayer insulation film 160 may be disposed to fill up a space between the bit lines BL. A second interlayer insulation film 170 may be disposed on the first interlayer insulation film 160 to cover the bit lines BL.

A storage node contact 162 and a landing pad 166 may be disposed in the first interlayer insulation film 160 and the second interlayer insulation film 170 between the bit lines BL. The storage node contact 162 may be electrically in contact with the second source/drain region 106. An upper surface of the storage node contact 162 may be lower than the upper surface of the bit lines BL.

The landing pad 166 may be disposed on the storage node contact 162. The landing pad 166 may be vertically overlapped with at least a part of the upper surface of the bit lines BL. The bit line spacer 152 which is disposed between the landing pad 166 and the bit lines BL may prevent an electrical short from being induced therebetween.

A metal silicide film 164 may be disposed between the storage node contact 162 and the landing pad 166. In some example embodiments, the metal silicide film 164 may comprise, for example, a cobalt silicide film.

An etch stopper film 172 may be disposed on the second interlayer insulation film 170 to expose at least a part of an upper surface of the landing pad 166.

A capacitor 180 may be disposed on the second interlayer insulation film 170. The capacitor 180 may comprise a lower electrode 182, an upper electrode 186, and a dielectric film 184 disposed between the lower electrode 182 and the upper electrode 186. In FIG. 1, for the convenience of explanation, the landing pad 166 and the capacitor 180 are omitted.

A peripheral gate PG may be disposed on the second active region ACT2 in the peripheral circuit region PCR. The peripheral gate PG may comprise a second lower wiring pattern 126b, a second etching buffer pattern 128b, a second ohmic barrier pattern 142b, a second upper wiring pattern 144b, a second conductive capping pattern 146b, and a second insulation capping pattern 148b sequentially stacked one on another. The second ohmic barrier pattern 142b may be disposed between the second etching buffer pattern 128b and the second upper wiring pattern 144b. The second etching buffer pattern 128b may be disposed between the second lower wiring pattern 126b and the second ohmic barrier pattern 142b.

A peripheral gate dielectric pattern 125 may be disposed between the second active region ACT2 and the second lower wiring pattern 126b. In some example embodiments, the peripheral gate dielectric pattern 125 may comprise a silicon oxide film, a silicon oxynitride film, a high-k dielectric film having a dielectric constant which is greater than the silicon oxide, or combinations thereof. For example, the high-k dielectric film which is used as the peripheral gate dielectric pattern 125 may comprise $HfO_2$, HfSiO, HfSiON, HfTaO, HfTiO, HfZrO, a zirconium oxide, an aluminum oxide, a $HfO_2$—$Al_2O_3$ alloy, or combinations thereof, but, example embodiments are not limited thereto.

A peripheral gate spacer 154 may be disposed on sidewalls of the peripheral gate PG.

A third source/drain region 108 may be disposed in the second active region ACT2 at opposite sides of the peripheral gate PG.

The peripheral gate PG and the third source/drain region 108 may constitute a transistor. In some example embodiments, in the case where the second active region ACT2 of the substrate 100 corresponds to a well region having a N-type conductivity and the third source/drain region 108 has a P-type conductivity, the peripheral gate PG and the third source/drain region 108 may constitute a PMOS transistor. In this case, the second lower wiring pattern 126b may include a semiconductor film, or a metal. For example, the second lower wiring pattern 126b may be a semiconductor film that is doped with P-type dopants.

In some example embodiments, in the case in which the second active region ACT2 of the substrate 100 corresponds to a well region having a P-type conductivity and the third source/drain region 108 has a N-type conductivity, the peripheral gate PG and the third source/drain region 108 may constitute a NMOS transistor. In this case, the second lower wiring pattern 126b may include a semiconductor film or a metal. The second lower wiring pattern 126b may be a semiconductor film which is doped with N-type dopants.

The bit line BL of the cell array region CAR and the peripheral gate PG of the peripheral circuit region PCR may be disposed in the first interlayer insulation film 160. An upper surface of the first interlayer insulation film 160 may be disposed at substantially the same height as those of the bit lines BL and/or the peripheral gate PG. The second interlayer insulation film 170 may cover the bit lines BL in the cell array region CAR and the peripheral gate PG in the peripheral circuit region PCR. The etch stopper film 172 may be disposed on the second interlayer insulation film 170. The first interlayer insulation film 170 may include a silicon oxide. The second interlayer insulation film 170 may include a silicon nitride, and/or a silicon oxynitride. The etch stopper film 172 may include a silicon nitride, and/or a silicon oxynitride.

A peripheral circuit contact 163 may be disposed passing (or extending) through the first interlayer insulation film 160 to be in contact with the third source/drain region 108.

A peripheral circuit wiring 167 may be disposed in the second interlayer insulation film 170 to be in contact with the peripheral circuit contact 163. In addition, the peripheral circuit wiring 167 may be in contact with the bit lines BL or the word lines WL in the cell array region CAR. The upper surface of the landing pad 166 may be substantially coplanar with an upper surface of the peripheral circuit wiring 167.

The first lower wiring pattern 126a constituting the bit lines BL in the cell array region CAR may comprise the same material as the second lower wiring pattern 126b constituting the peripheral gate PG in the peripheral circuit region PCR. In some example embodiments, the first and second lower wiring patterns 126a and 126b may comprise a semiconductor film, for example, a silicon film.

A conductivity type of the first lower wiring pattern 126a in the cell array region CAR may be different from a conductivity type of the second lower wiring pattern 126b in the peripheral circuit region PCR. Alternatively, the first lower wiring pattern 126a may be the same conductivity type as the second lower wiring pattern 126b.

In some example embodiments, the first and second lower wiring patterns 126a and 126b may comprise an undoped silicon film. Alternatively, the lower wiring patterns 126a and 126b may comprise a metal film, but example embodiments are not limited thereto.

The first lower wiring pattern 126a constituting the bit lines BL in the cell array region CAR and the second lower wiring pattern 126b constituting the peripheral gate PG in the peripheral circuit region PCR may have substantially the same thickness with each other. Unless otherwise defined throughout the specification, a term "thickness" means a size in a direction perpendicular with respect to the substrate 100.

The first etching buffer pattern 128a constituting the bit lines BL and the second etching buffer pattern 128b constituting the peripheral gate PG may include the same material with each other. The first and second etching buffer patterns 128a and 128b may comprise a material of lanthanide series, for example, lanthanoids. In some example embodiments, the first and second etching buffer patterns 128a and 128b may comprise a lanthanum film, a lanthanum oxide, or a combination thereof. The lanthanum oxide may have a conductivity property due to a relatively thin thickness. In some example embodiments, the first and second etching buffer patterns 128a and 128b may have a thickness of about 10 Å or less.

The first ohmic barrier pattern 142a constituting the bit lines BL may comprise the same material as the second ohmic barrier pattern 142b constituting the peripheral gate PG. In some example embodiments, the first and second ohmic barrier patterns 142a and 142b may comprise a metal silicon nitride and/or a metal silicide. In some example embodiments, the first and second barrier patterns 142a and 142b may include at least one of a titanium silicon nitride, a tungsten silicon nitride, a tantalum silicon nitride, a titanium silicide, and combinations thereof.

The first upper wiring pattern 144a constituting the bit line BL and the second upper wiring pattern 144b constituting the peripheral gate PG may comprise the same material with each other. In some example embodiments, the first and second upper wiring patterns 144a and 144b may include a metal silicide. In some example embodiments, the first and second upper wiring patterns 144a and 144b may include at least one of a tungsten silicide, a titanium silicide, a tantalum silicide, a cobalt silicide, and combinations thereof.

The first conductive capping pattern 146a constituting the bit lines BL and the second conductive capping pattern 146b constituting the peripheral gate PG may include the same material with each other. In some example embodiments, the first and second conductive capping patterns 146a and 146b may comprise a metal film and/or nitride(s) thereof. In some example embodiments, the first and second conductive capping patterns 146a and 146b may comprise tungsten, titanium, tantalum, cobalt, and/or nitride(s) thereof.

The first insulation capping pattern 148a of the bit lines BL and the second insulation capping pattern 148b of the peripheral gate PG may include at least one of a silicon oxide, a silicon nitride, a silicon oxynitride, and combinations thereof.

The bit lines BL disposed in the cell array region CAR, with the exception of the first source/drain region 104, may have the same structure as the peripheral gate PG disposed in the peripheral circuit region PCR.

The first etching buffer pattern 128a may not be disposed between the bit line contact 134 and the first ohmic barrier pattern 142a on the first source/drain region 104 in the cell array region CAR. On the other hand, the first etching buffer pattern 128a may be disposed between the first lower wiring pattern 126a and the first ohmic barrier pattern 142a in the cell array region CAR except the first source/drain region 104, for example, on the field isolation region 102. In addition, the second etching buffer pattern 128b may be disposed between the second lower wiring pattern 126b and the second ohmic barrier pattern 142b in the peripheral circuit region PCR. If the first and second lower wiring patterns 126a and 126b are used as an etch buffer in the etching process for forming the first and second ohmic barrier patterns 142a and 142b instead of the first and second etching buffer patterns 128a and 128b, then the first and second lower wiring patterns 126a and 126b may have relatively thick thicknesses. However, as the thicknesses of the first and second lower wiring patterns 126a and 126b are thick, a parasitic capacitance may increase. Therefore, if the first and second etching buffer patterns 128a and 128b are used as an etch buffer in the etching process for forming the first and second ohmic barrier patterns 142a and 142b, the thicknesses of the first and second lower wiring patterns 126a and 126b may be reduced. By the first and second etching buffer patterns 128a and 128b having thin thicknesses, the thicknesses of the first and second lower wiring patterns 126a and 126b may be reduced by about half. For example, in the case where the first and second etching buffer patterns 128a and 128b are not used as an etch buffer, the first and second lower wiring patterns 126a and 126b therebelow may be needed to have a thickness of about 620 Å. However, in the case where the first and second etching buffer patterns 128a and 128b are used as an etch buffer, the first and second lower wiring patterns 126a and 126b therebelow may be reduced to have a thickness of about 320 Å. As a result, the whole stack height of the semiconductor device may be reduced. Further, the parasitic capacitance of the bit lines BL in the cell array region CAR and the peripheral gate PG in the peripheral circuit region PCR may decrease.

The semiconductor devices according to example embodiments of the inventive concepts has been particularly shown and described with reference to example embodiments. However, the exemplary embodiments are not limited thereto and various modifications and changes may be made.

FIGS. 3A to 7C illustrate cross-sectional views of sequential processes in manufacturing methods of semiconductor devices according to other example embodiments, FIGS. 3A to 7A illustrate cross-sectional views taken along a line I-I' of FIG. 1, FIGS. 3B to 7B illustrate cross-sectional views taken along a line II-II' of FIG. 1, and FIGS. 3C to 7C illustrate cross-sectional views taken along a line III-III' of FIG. 1.

In example embodiments, manufacturing methods of semiconductor devices shown in FIGS. 2A to 2C will be described with illustration. In FIGS. 3C to 7C, the same elements as those in FIGS. 2A to 2C are denoted by the same reference numerals and detailed explanation thereof will not be given in order to avoid a repeated explanation.

Referring to FIGS. 1, 3A, 3B, and 3C, a substrate 100 may be provided. The substrate 100 may include a semiconductor substrate which is formed of, for example, silicon, germanium, and/or silicon-germanium. A field isolation region 102 is formed in the substrate 100 to delimit first active regions ACT1 in a cell array region CAR and a second active region ACT2 in a peripheral circuit region PCR. The first active regions ACT1 may be bar-shaped spaced apart from each other in a plan view and extend in a third direction (i.e., s-axis direction) non-perpendicular to both of the first direction (i.e., x-axis direction) and the second direction (i.e., y-axis direction). The first direction and the second direction may cross with each other.

Trenches 103 may be formed to extend in the second direction in the cell array region CAR. At least two trenches 103 may cross one of the first active regions ACT1. Cell gate structures 110 may be formed in the trenches 103. Each of the cell gate structures 110 may comprise a cell gate insulation film 112, a cell gate conductive pattern 114, and a cell gate capping pattern 116. A bottom surface of the cell gate structures 110 may be higher than a bottom surface of the field isolation region 102. A first source/drain region 104 may be formed in an upper portion of the first active region ACT1 between the cell gate structures 110. Second source/drain regions 106 may be formed at the edges of the first active region ACT1 at opposite sides of the first source/drain region 104.

A cell blocking film 124 may be formed on the substrate 100. The cell blocking film 124 may be removed on the second active region ACT2. Therefore, the cell blocking film 124 may be left only on the first active region ACT1. The cell blocking film 124 may include a first cell blocking film 121 and a second cell blocking film 122. Each of the first and second cell blocking films 121 and 122 may comprise at least one of silicon nitride, silicon oxynitride, silicon oxide, and combinations thereof. For example, the first cell blocking film 121 may be silicon oxide and the second cell blocking film 122 may be silicon nitride.

A peripheral gate dielectric film 123 may be formed in the peripheral circuit region PCR. The peripheral gate dielectric film 123 may be removed in the cell array region CAR. The peripheral gate dielectric film 123 may include at least one of a silicon oxide, a silicon oxynitride, a high-k dielectric film having a dielectric constant greater than the silicon oxide, and combinations thereof. Alternatively, after forming the peripheral gate dielectric film 123 in the peripheral circuit region PCR, the cell blocking film 124 may be formed in the cell array region CAR.

A lower wiring film 126 may be formed on the substrate 100 which includes the cell blocking film 124 and the peripheral gate dielectric film 123. The lower wiring film 126 may comprise a semiconductor film and/or a metal film. For example, the semiconductor film may comprise silicon. The lower wiring film 126 may be formed to have a thickness of about 350 Å.

The lower wiring film 126 in the cell array region CAR may be a doped silicon film. Alternatively, the lower wiring film 126 of the cell array region CAR may be an undoped silicon film.

The lower wiring film 126 of the peripheral circuit region PCR may be a semiconductor film doped with N-type impurities or P-type impurities. In order to form the semiconductor film, after forming a mask pattern (not shown) covering the cell array region CAR, an impurity injection process may be performed into the lower wiring film 126 of the peripheral circuit region PCR. According to whether the transistor of the peripheral circuit region PCR is a PMOS transistor or a NMOS transistor, the lower wiring film 126 doped with the impurities may have a P-type conductivity or a N-type conductivity.

An upper surface of the lower wiring film 126 may be planarized by using an etch-back process and/or a CMP (Chemical Mechanical Polishing) process. Accordingly, the lower wiring film 126 may have a thickness of about 320 Å.

An etching buffer film 128 may be formed on the lower wiring film 126. The etching buffer film 128 may include lanthanoids. For example, the etching buffer film 128 may comprise at least one of a lanthanum film, a lanthanum oxide, and a combination thereof. The etching buffer film 128 may have a thickness of about 10 Å or less.

A first mask pattern 130 may be formed on the etching buffer film 128. The first mask pattern 130 may have an opening 131 which is vertically overlapped with the first source/drain region 104 of the first active region ACT1. The opening 131 may expose at least a part of the etching buffer film 128.

Figure 4A:
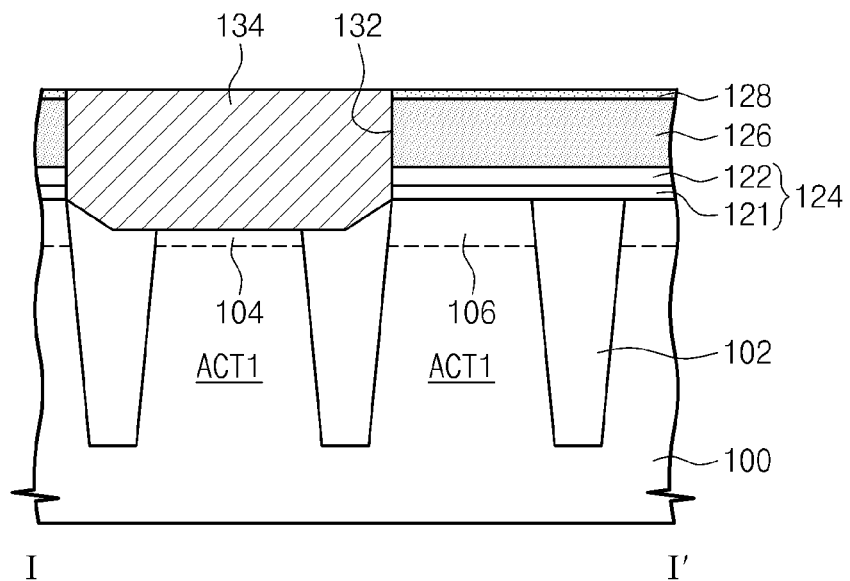
Figure 4B:
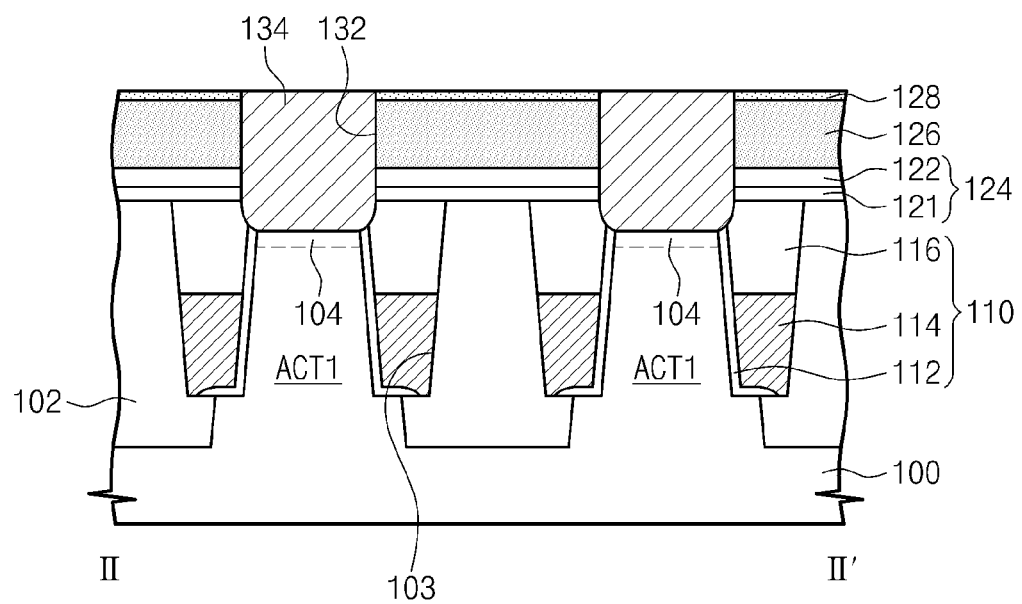
Figure 4C:
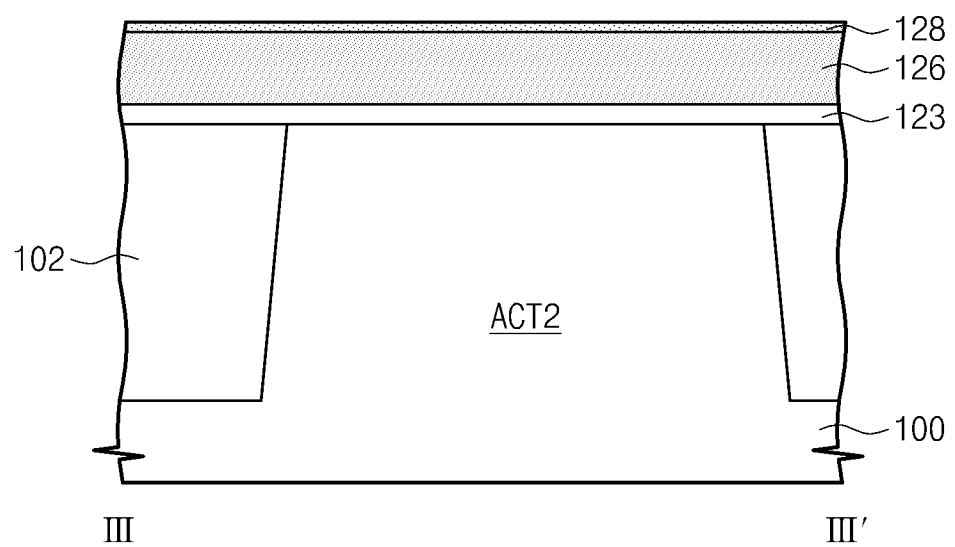

Referring to FIGS. 4A, 4B, and 4C, the etching buffer film 128, the lower wiring film 126 and the cell blocking film 124 are sequentially etched by using the first mask pattern 130 as an etch mask. As a result, a first contact hole 132 may be formed to expose at least a part of the first source/drain region 104 and the field isolation region 102. The first contact hole 132 may be formed to have a width greater than that of the first source/drain region 104. By an over etching, a bottom surface of the first contact hole 132 may be lower than a top surface of the substrate 100. The first contact hole 132 may be a circle shape or an oval-shaped.

A bit line contact 134 may be formed to fill the first contact hole 132. The bit line contact 134 may include a semiconductor film. For example, the semiconductor film may be a doped silicon film. The bit line contact 134 may be formed by (i) removing the first mask pattern 130, (ii) forming the semiconductor film filling the first contact hole 132, and then, (iii) planarizing the semiconductor film to expose a top surface of the etching buffer film 128.

The bit line contact 134 may be in-situ doped with the same impurities as those of the first source/drain region 104 during forming the semiconductor film.

The etching buffer film 128 may not be formed on the bit line contact 134, but may be left on the lower wiring film 126. A side surface of the bit line contact 134 may be in contact with a side surface of the lower wiring film 126. An upper surface of the bit line contact 134 may be substantially the same height as an upper surface of the etching buffer film 128. The thickness of the lower wiring film 126 may be about 400 Å. The thickness of the bit line contact 134 may be greater than that of the lower wiring film 126.

Figure 5A:
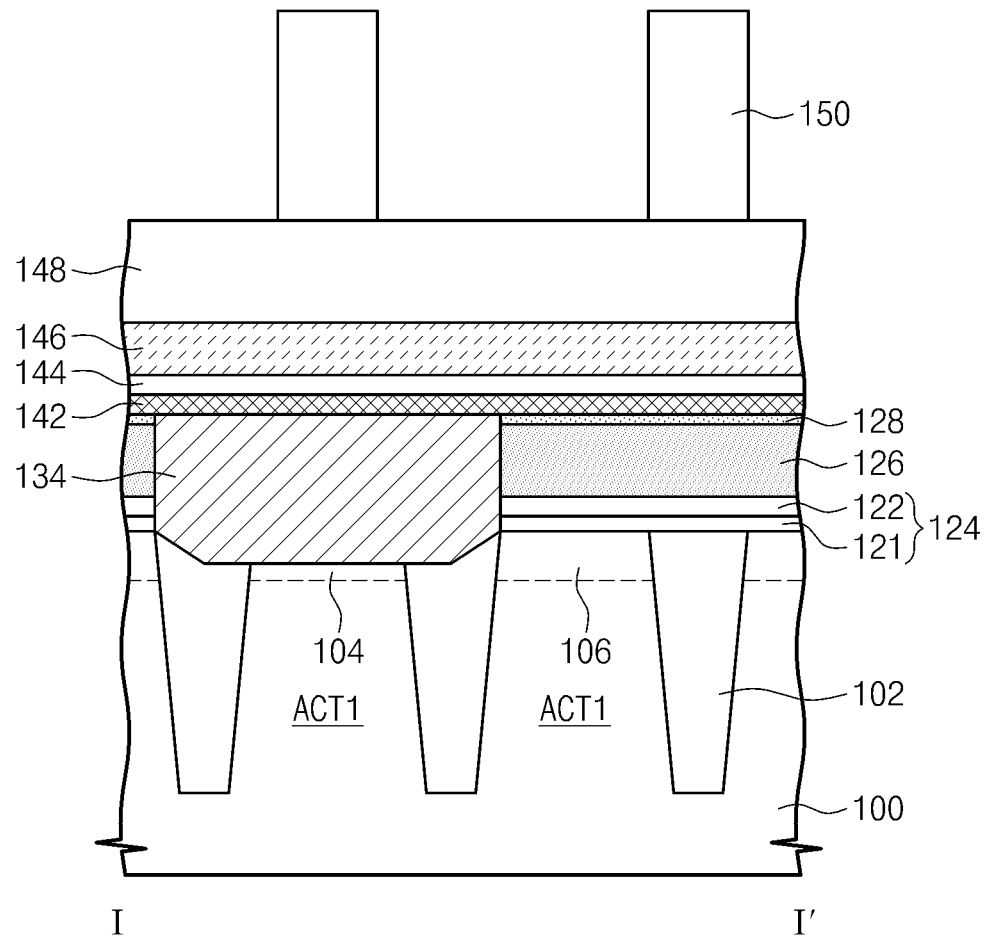
Figure 5B:
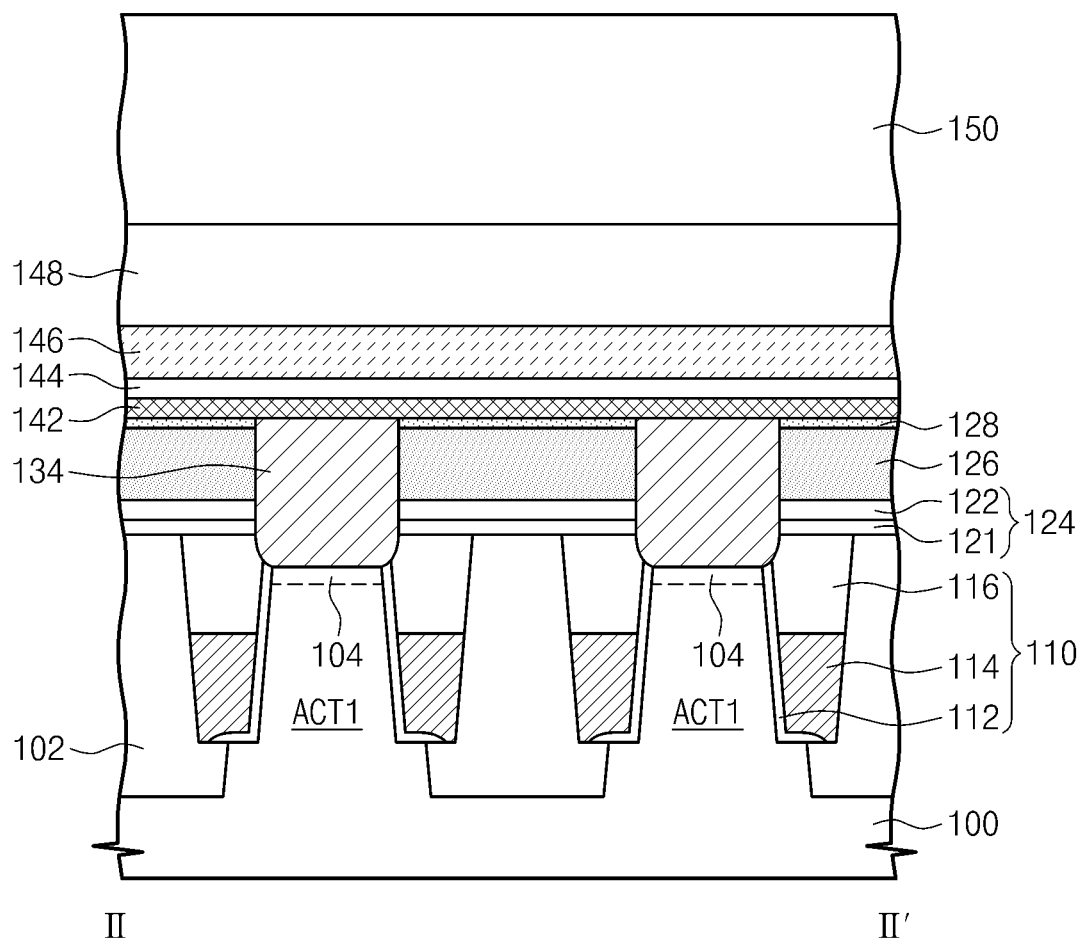
Figure 5C:
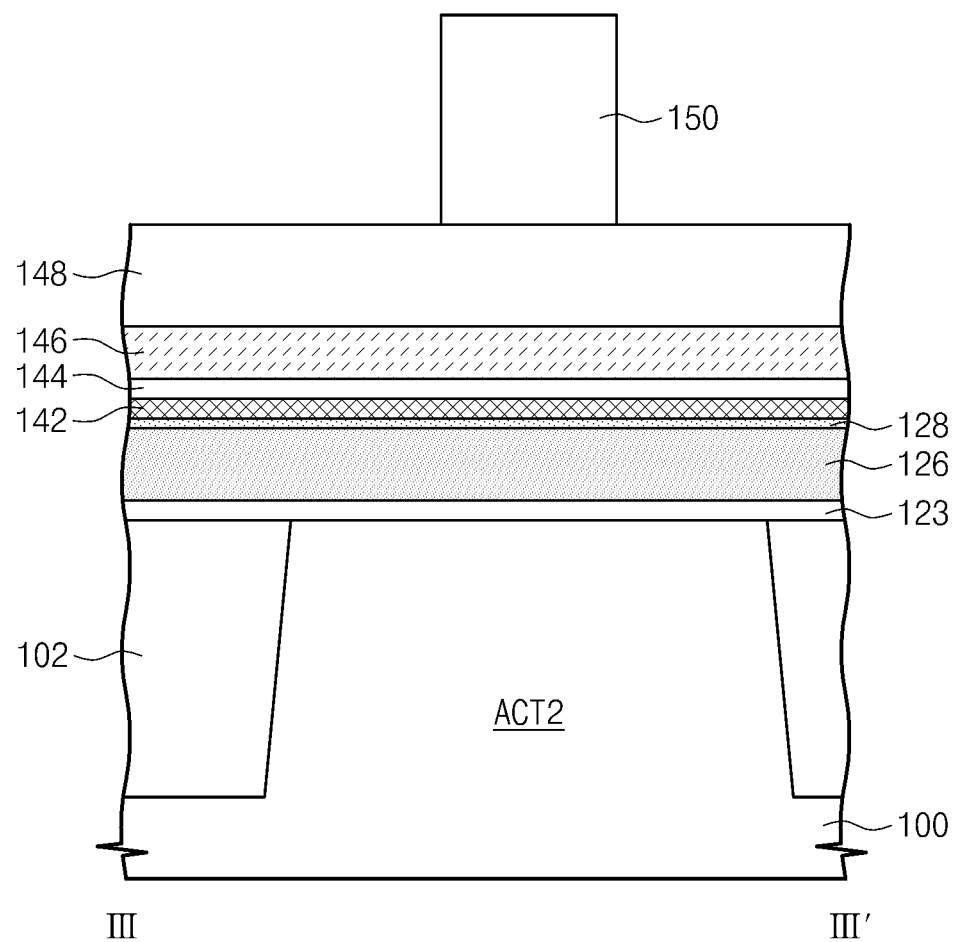

Referring to FIGS. 5A, 5B, and 5C, after removing the first mask pattern 130, an ohmic barrier film 142, an upper wiring film 144, a conductive capping film 146, and an insulation capping film 148 may be sequentially formed in the cell array region CAR and the peripheral circuit region PCR.

The ohmic barrier film 142 may be in contact with the upper surface of each of the bit line contact 134 and the etching buffer film 128.

The ohmic barrier film 142 may be formed of a metal silicon nitride and/or a metal silicide. In some example embodiments, the ohmic barrier film 142 may be formed of at least one of a titanium silicon nitride, a tungsten silicon nitride, a tantalum silicon nitride, a titanium silicide, and combinations thereof. For example, the ohmic barrier film 142 may be formed by a CVD or ALD process using a source gas including $TiCl_4$, di-chlorosilane (DCS), and $NH_3$. For example, the process for forming the ohmic barrier layer 142 may be performed at a temperature within a range of about 560° C. to about 680° C. In some example embodiments, the source gas may include $SiH_4$ instead of DCS. The ohmic barrier film 142 may be formed by a thickness of about 50 Å.

The upper wiring film 144 may include a metal silicide. In some example embodiments, the upper wiring film 144 may include at least one of a tungsten silicide, a titanium silicide, a tantalum silicide, a cobalt silicide, and combinations thereof. The upper wiring film 144 may be formed by a thickness of about 50 Å.

The conductive capping film 146 may be formed of a metal film and/or nitride(s) thereof. In some example embodiments, the conductive capping film 146 may be formed of tungsten, titanium, tantalum, cobalt, and/or nitride(s) thereof. The conductive capping film 146 may be formed by a thickness of about 300 Å.

The insulation capping film 148 may be formed of a silicon oxide, a silicon nitride, and/or a silicon oxynitride. The conductive capping film 146 and the insulation capping film 148 may be formed by a sputtering or a CVD process.

A second mask pattern 150 may be formed on the insulation capping film 148. The second mask pattern 150 may overlap respective portions corresponding to the bit lines BL and the peripheral gate PG in FIGS. 2A to 2C.

Figure 6A:
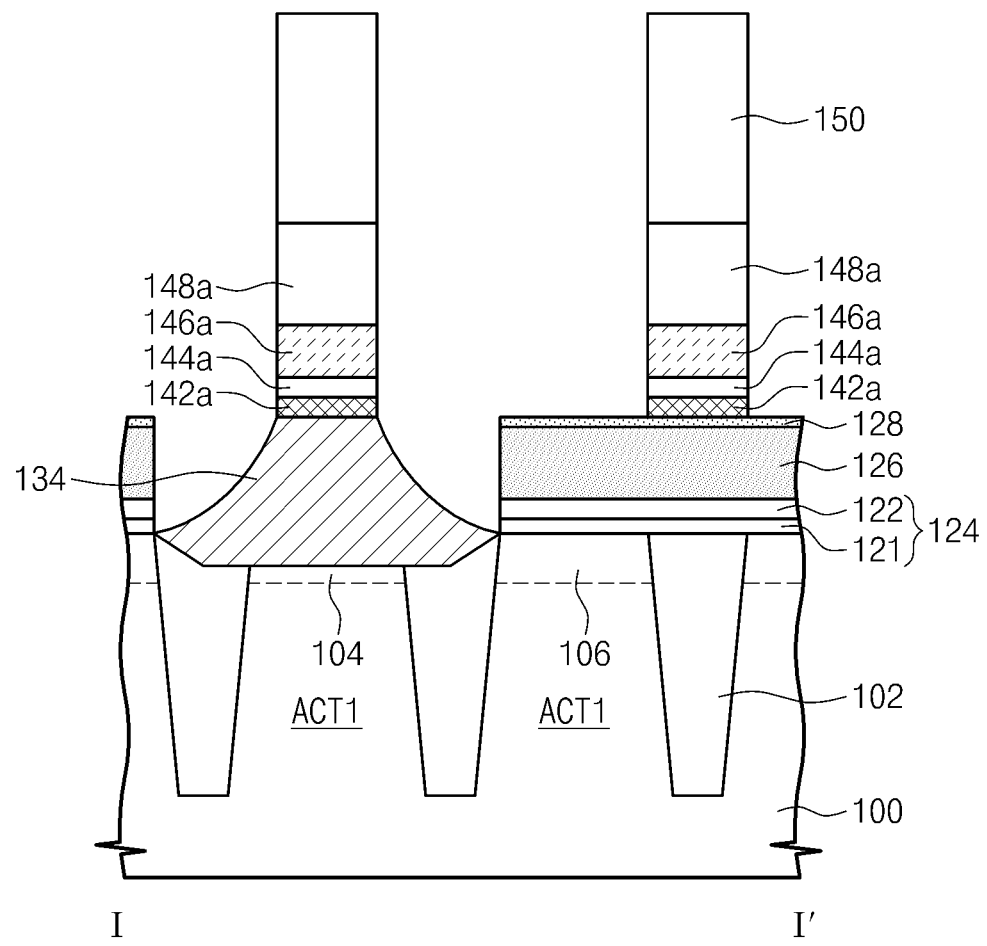
Figure 6B:
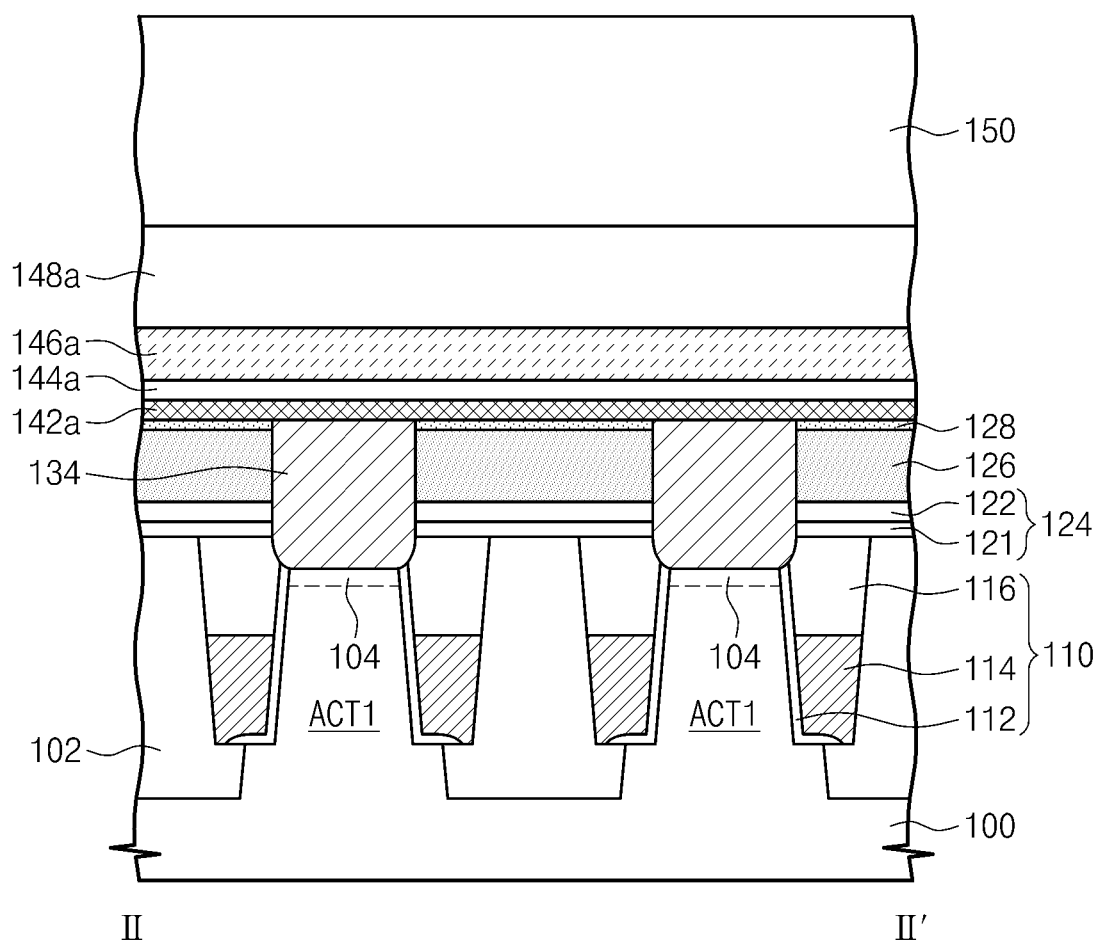
Figure 6C:
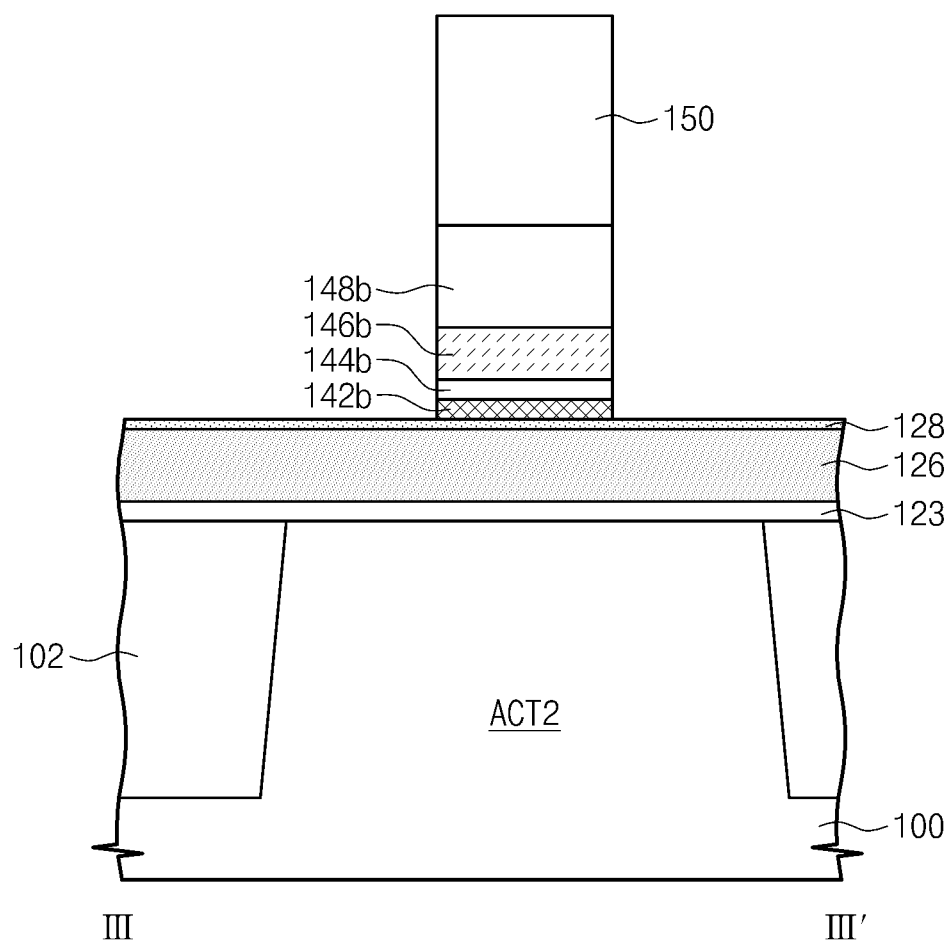

Referring to FIGS. 6A, 6B, and 6C, first and second insulation capping patterns 148a and 148b, first and second conductive capping patterns 146a and 146b, first and second upper wiring patterns 144a and 144b, and the first and second ohmic barrier patterns 142a and 142b may be formed by sequentially etching the insulation capping film 148, the conductive capping film 146, the upper wiring film 144, the ohmic barrier film 142, and the bit line contact 134 using the second mask pattern 150 as an etch mask. When viewed from a cross-section view taken along a second direction (i.e., y-axis direction), the bit line contact 134 may expose at least a part of sidewalls of the lower wiring film 126. The etch process may be performed by a dry etch process and/or a wet etch process. In some example embodiments, the etch process may stop on the etching buffer film 128 in the cell array region CAR and the peripheral circuit region PCR. In other words, the etching buffer film 128 may not be etched in the etch process and may remain on the lower wiring film 126. An etchant which is used for etching the ohmic barrier film 142 may have a considerably high etch selectivity with respect to the etching buffer film 128 (e.g., a lanthanum). Therefore, the etching buffer film 128 may act as an etch buffer in the process for etching the ohmic barrier film 142. The lower wiring film 126 under the etching buffer film 128 may act as not the etch buffer in the etch process but only a gate electrode and/or a wiring. At least a part of the etching buffer film 128 may be exposed through the etch process.

According to a process for patterning the lower wiring film 126 without the etching buffer film 128, a pitting phenomenon may occur in the second active region ACT2 of the peripheral circuit region PCR due to a difference in the thicknesses between the bit line contact 134 and the lower wiring film 126. In more detail, if the etching buffer patterns 128a and 128b are not used as the etch buffer, the lower wiring patterns 126a and 126b may act as the etch buffer in the etch process for forming the ohmic barrier patterns 142a and 142b. In this case, the lower wiring film 126a and 126b may have a thick thickness. However, as the thickness of the lower wiring patterns 126a and 126b is thick, a parasitic capacitance may increase.

Accordingly, the pitting may be prevented by use of the etching buffer film 128 according to example embodiments. In addition, as the thickness of the lower wiring film 126 is reduced, the parasitic capacitance may decrease. In other words, in the case where the etching buffer patterns 128a and 128b are used as the etch buffer in the etch process for forming the ohmic barrier patterns 142a and 142b, the thickness of the lower wiring patterns 126a and 126b may be reduced. Even though the thickness of the etching buffer patterns 128a and 128b are thin, the thickness of the lower wiring patterns 126a and the 126b may be reduced by about half. For example, in the case in which the etching buffer patterns 128a and 128b are not used as the etch buffer, the lower wiring patterns 126a and 126b thereunder may be formed to have a thickness of about 620 Å. However, in the case in which the etching buffer patterns 128a and 128b are used as the etch buffer, the lower wiring patterns 126a and 126b thereunder may be reduced to have a thickness of about 320 Å. As a result, the whole stack height of the semiconductor device may be reduced. Further, the parasitic capacitances of the bit lines BL in the cell array region CAR and the peripheral gate PG in the peripheral circuit region PCR may decrease.

Figure 7A:
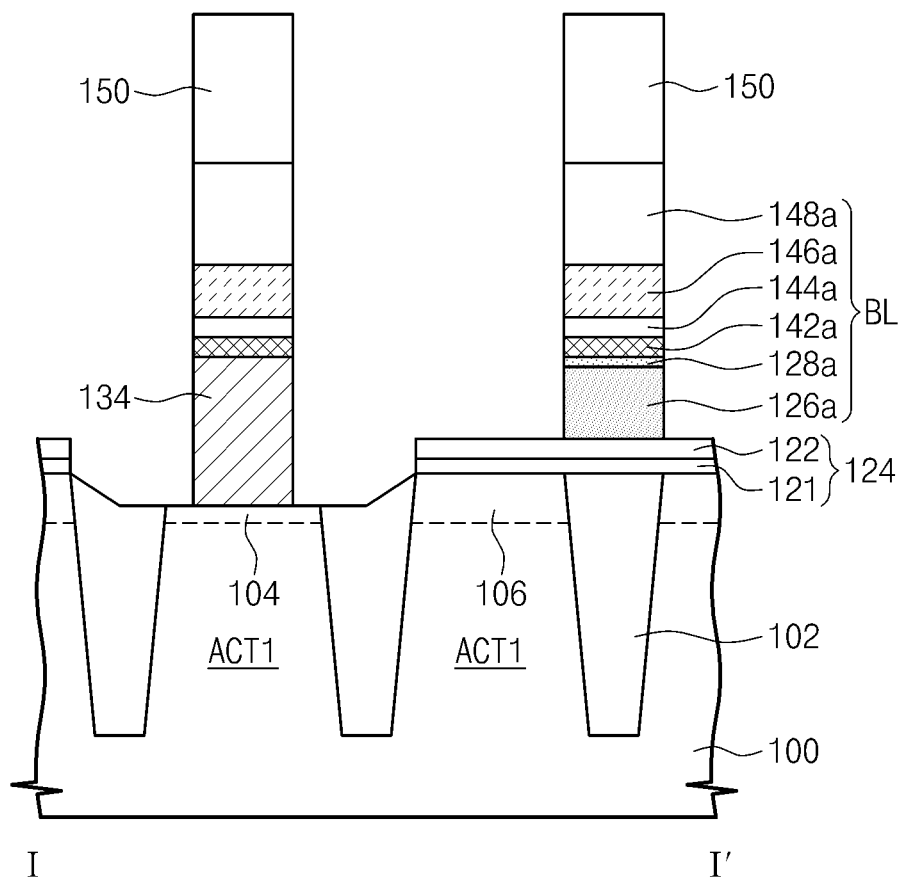
Figure 7B:
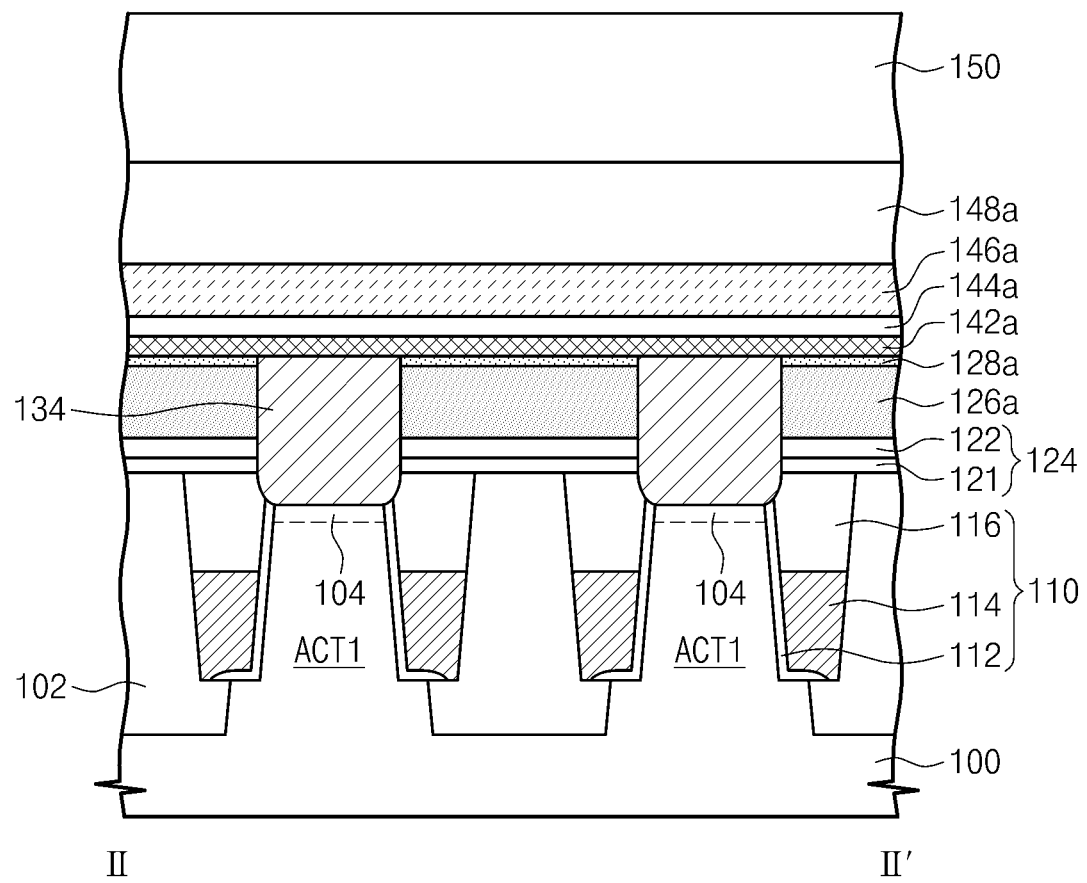
Figure 7C:
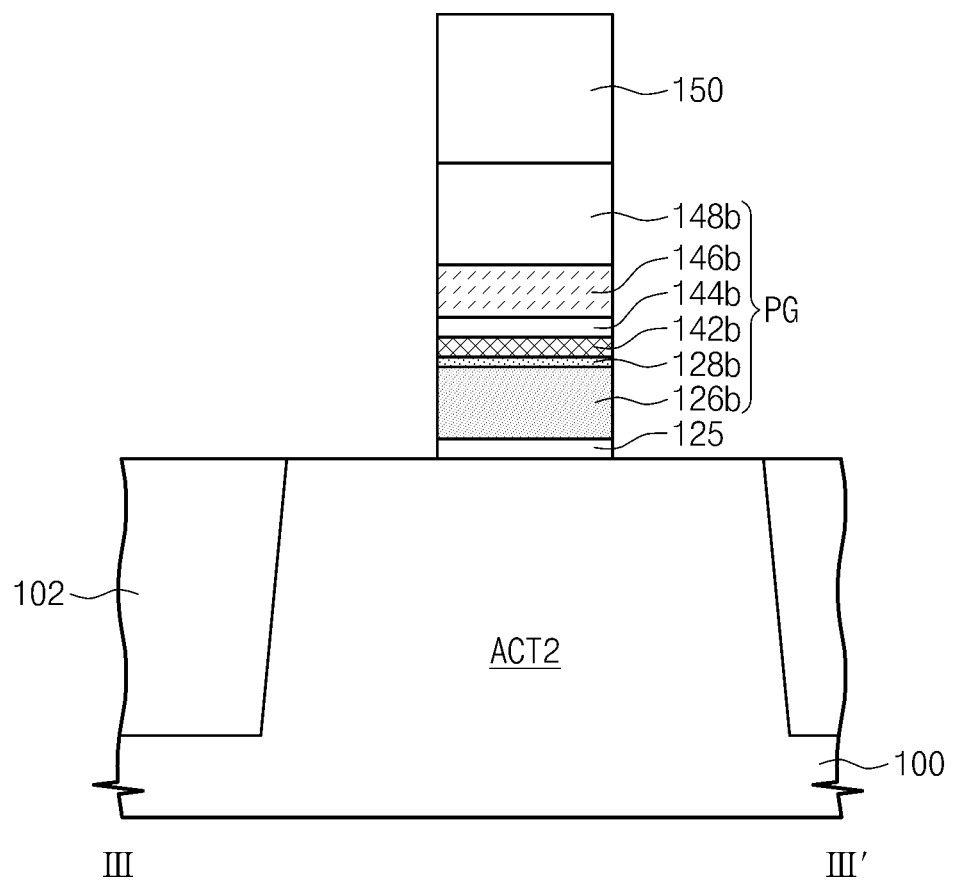

Referring to FIGS. 7A, 7B, and 7C, first and second etching buffer patterns 128a and 128b may be formed in the cell array region CAR and the peripheral circuit region PCR by etching the exposed etching buffer film 128. The etch process may be performed by a wet etch process. For example, the wet etch process may include a cleaning process using hydrogen chloride (HCl). The lower wiring film 126 may be partially exposed.

The bit line contact 134 and the lower wiring film 126 may be etched by using the second mask pattern 150 as an etch mask. When viewed from a cross-sectional view taken along a second direction (i.e., y-axis direction), at least a part of the field isolation region 102 may be exposed. First and second lower wiring patterns 126a and 126b may be formed by etching the lower wiring film 126 using the second mask pattern 150 as the etch mask. The first lower wiring pattern 126a in the cell array region CAR may allow the cell blocking film 124 thereunder to be exposed. The cell blocking film 124 may be partially removed. The second lower wiring pattern 126b in the peripheral circuit region PCR may allow the peripheral gate dielectric film 123 thereunder to be exposed. The exposed portion of the peripheral gate dielectric film 123 may be removed by a wet etch and/or a dry etch, thereby to form a peripheral gate dielectric pattern 125.

As a result, a plurality of bit lines BL may be formed to extend in the first direction in the cell array region CAR in which the cell blocking film 124 is disposed. Each of the bit lines BL may comprise the first lower wiring pattern 126a, the first etching buffer pattern 128a, the first ohmic barrier pattern 142a, the first upper wiring pattern 144a, the first conductive capping pattern 146a, and the first insulation capping pattern 148a which are sequentially stacked one on another. Each of the bit lines BL may be in contact with the first source/drain region 104 of the first active region ACT1 through the bit line contact 134. The bit line contact 134 may pass through the cell blocking film 124, the first lower wiring pattern 126a, and the first etching buffer pattern 128a. The upper surface of the bit line contact 134 may be in contact with the first ohmic barrier pattern 142a and a bottom surface of the bit line contact 134 may be in contact with the first source/drain region 104. The side surface of the bit line contact 134 may be in contact with the first lower wiring pattern 126a and the first etching buffer pattern 128a.

Further, the peripheral gate PG comprising the peripheral gate dielectric pattern 125, the second lower wiring pattern 126b, the second etching buffer pattern 128b, the second upper wiring pattern 144b, the second conductive capping pattern 146b, and the second insulation capping pattern 148b may be formed in the peripheral circuit region PCR.

Referring again to FIGS. 2A to 2C, after removing the second mask pattern 150, a bit line spacer 152 may be formed on sidewalls of the bit lines BL. The bit line spacer 152 may cover at least a part of the field isolation region 102. In addition, a peripheral gate spacer 154 may be formed on sidewalls of the peripheral gate PG.

A third source/drain region 108 may be formed in the second active region ACT2 on opposite sides of the peripheral gate PG. The third source/drain region 108 may be formed by injecting impurity ions having the same conductivity type as the second lower wiring pattern 126b in the second active region ACT2 exposed by the peripheral gate PG.

A first interlayer insulation film 160 may be formed on the substrate 100 to cover the bit lines BL in the cell array region CAR and the peripheral gate PG in the peripheral circuit region PCR. The first interlayer insulation film 160 may be planarized to expose an upper surface of the first insulation capping pattern 148a of the bit lines BL and/or an upper surface of the second insulation capping pattern 148b of the peripheral gate PG.

A second contact hole 161 may be formed to expose the second source/drain region 106 by patterning the first interlayer insulation film 160 and the cell blocking film 124 in the cell array region CAR. A storage node contact 162 may be formed in the second contact hole 161 to be in contact with the second source/drain region 106. An upper surface of the storage node contact 162 may be recessed to have a height thereof lower than an upper surface of the bit lines BL.

A landing pad 166 may be formed to be vertically overlapped with the bit lines BL on the storage node contact 162. A metal silicide film 164 may be formed between the storage node contact 162 and the landing pad 166.

A peripheral circuit contact 163 may be formed to be in contact with the third source/drain region 108 by passing through the first interlayer insulation film 160 in the peripheral circuit region PCR. A peripheral circuit wiring 167 may be formed on the first interlayer insulation film 160 to be connected to the peripheral circuit contact 163.

A second interlayer insulation film 170 may be formed on the first interlayer insulation film 160. The second interlayer insulation film 170 may expose at least a part of the landing pad 166 and/or the peripheral circuit wiring 167. The landing pad 166 of the cell array region CAR and the peripheral circuit wiring 167 of the peripheral circuit region PCR may be concurrently patterned.

An etch stopper film 172 may be formed to expose the landing pad 166 on the second interlayer insulation film 170.

A capacitor 180 may be formed on the second interlayer insulation film 170. The capacitor may include a lower electrode 182, an upper electrode 186, and a dielectric film 184 formed between the lower electrode 182 and the upper electrode. The lower electrode 182 may be in contact with the landing pad 166.

As set forth above, according to example embodiments of the present inventive concepts, it may be possible to simultaneously pattern a bit line in a cell array region and a peripheral gate in a peripheral circuit region in a semiconductor device. Accordingly, the manufacturing process of the semiconductor device may be simplified and the manufacturing cost thereof the may be reduced. A pitting which is occurred in an active region of the peripheral circuit region during etching process for forming the bit line of the cell array region may be prevented by using an etching buffer pattern disposed between a lower wiring pattern and an ohmic barrier pattern of the peripheral gate in the peripheral circuit region. Also, in the etching process for forming the ohmic barrier pattern, the etching buffer pattern having a higher etch selectivity and a thinner thickness than the ohmic barrier pattern acts as an etch buffer, thereby reducing a thickness of the lower wiring pattern disposed under the ohmic barrier pattern. Therefore, a height of the semiconductor device may be lowered, and an operation property of the semiconductor device may be improved by reducing parasitic capacitances of the bit line and the peripheral gate.

Figure 8:
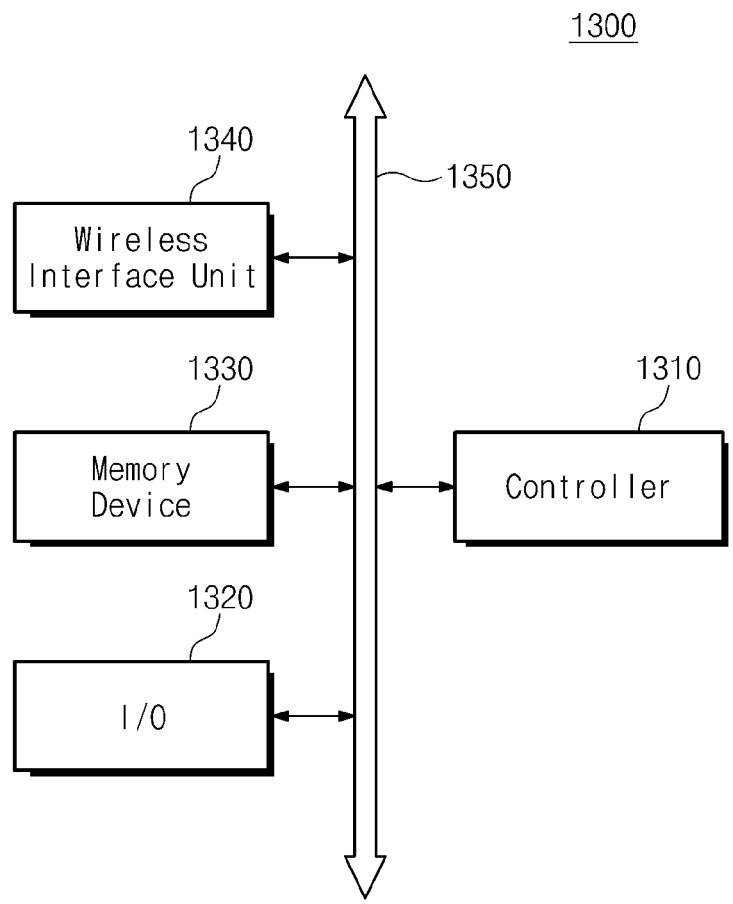

FIG. 8 illustrates a schematic block diagram of electronic devices including semiconductor devices according to yet other example embodiments.

Referring to FIG. 8, an electronic device 1300 according to an example embodiment may be one of a personal digital assistant (PDA), a laptop computer, a portable computer, a web tablet, a wireless phone, a mobile phone, a digital music player, a cable or wireless electronic device, and an electronic device including any combination thereof. The electronic device 1300 may include a controller 1310, an input/output (I/O) unit 1320 such as a keypad, a key board, and/or a display, a memory device 1330, and a wireless interface unit 1340 which communicates with each other through the data bus 1350.

The controller 1310 may include at least one of a microprocessor, a digital signal processor, a microcontroller or other logic devices. The other logic devices may have a similar function to any one of the microprocessor, the digital signal processor and the microcontroller. The memory device 1330 may store user data and/or commands. The memory device 1330 may include at least one of the semiconductor devices according to the example embodiments described herein. The electronic device 1300 may transmit data to a wireless communication network using a radio frequency (RF) signal and/or receive data from the network through the wireless interface unit 1340. For example, the wireless interface unit 1340 may include an antenna or a wireless transceiver. The electronic device 1300 may be used in a communication interface protocol such as CDMA, GSM, NADC, E-TDMA, WCDMA, and/or CDMA2000.

Figure 9:
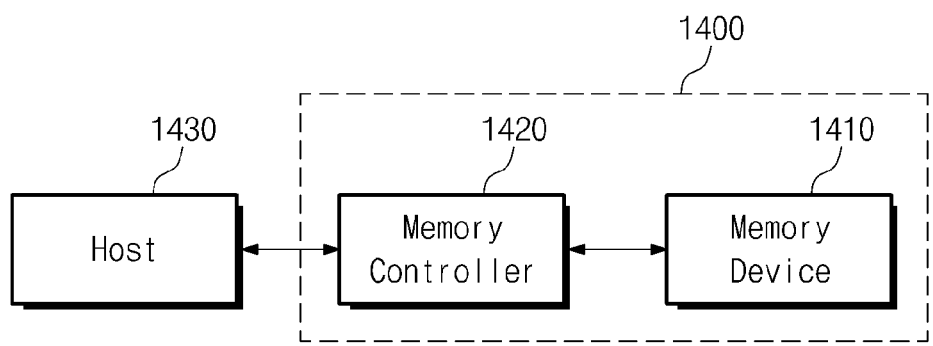

FIG. 9 illustrates a schematic block diagram of an example of memory systems including semiconductor devices according to further example embodiments.

Referring to FIG. 9, the semiconductor devices according to example embodiments may be used for realizing a memory system 1400. The memory system 1400 may include a memory device 1410 and a memory controller 1420 configured for storing data. The memory controller 1420 may read data stored in the memory device 1410 or write data to the memory device 1410 in response to read/write request of a host 1430. The memory controller 1420 may constitute an address mapping table for mapping an address provided from the host 1430 (e.g., a mobile device or a computer system) into a physical address of the memory device 1410. The memory device 1410 may include at least one of the semiconductor devices according to the example embodiments described herein.

While example embodiments of the inventive concepts have been described with reference to example embodiments, it will be apparent to those skilled in the art that various changes and modifications may be made without departing from the spirit and scope of the example embodiments of the inventive concepts. Therefore, it should be understood that the above example embodiments are not limiting, but illustrative. Thus, the scope of the example embodiments is to be determined by the broadest permissible interpretation of the following claims and their equivalents, and shall not be restricted or limited by the foregoing description.

What is claimed:

1. A method of forming semiconductor device, comprising:

preparing a substrate including a cell array region having a first active region delimited by a field isolation region, and a peripheral circuit region having a second active region, the first active region including a first source/drain region and second source/drain regions at opposite sides of the first source/drain region;

forming a first wiring film and an etching buffer film in the cell array region and the peripheral circuit region;

forming a contact hole by patterning the etching buffer film and the first wiring film to at least partially expose the first source/drain region and the field isolation region adjacent to the first source/drain region;

forming a bit line contact in the contact hole so as to be in contact with the first source/drain region;

forming a second wiring film over the substrate; and forming a bit line in the cell array region and a peripheral gate in the peripheral circuit region by patterning the second wiring film, the etching buffer film, and the first wiring film, the forming a bit line including patterning the second wiring film and the bit line contact on the first source/drain region in the cell array region, and the forming a peripheral gate including patterning the second wiring film to at least partially expose the etching buffer film in the peripheral circuit region.

2. The method of claim 1, wherein the forming a bit line further comprises patterning the second wiring film to at least partially expose the etching buffer film in the cell array region.

3. The method of claim 2, wherein the patterning the second wiring film and the bit line contact on the first source/drain region in the cell array region further comprises at least partially exposing the contact hole so as to expose at least a part of side walls of at least one selected from the etching buffer film, the first wiring film and a combination thereof.

4. The method of claim 3, wherein the forming a bit line in the cell array region and a peripheral gate in the peripheral circuit region further comprises
partially exposing an adjacent field isolation region by additionally patterning the bit line contact on the first source/drain region in the cell array region; and
patterning the exposed etching buffer film and the first wiring film in the cell array region and the peripheral circuit region.

5. The method of claim 1, wherein
the first wiring film comprises a semiconductor film, and
the forming a second wiring film comprises forming at least one of an ohmic barrier film, a metal silicide film, a metal film, and combinations thereof,
the ohmic barrier film including at least one selected from a titanium silicon nitride, a tungsten silicon nitride, a tantalum silicon nitride, a titanium silicide, and combinations thereof.

6. The method of claim 1, wherein the etching buffer film comprises a lanthanum film, a lanthanum oxide, or a combination thereof.

7. A method of forming semiconductor device, comprising:
preparing a substrate including a cell array region having an active region and a peripheral circuit region;
forming a first wiring film and an etching buffer film in the cell array region and a peripheral circuit region;
forming a bit line contact so as to be in contact with the active region by passing through the etching buffer film and the first wiring film;
forming a second wiring film on the etching buffer film and the bit line contact; and
forming a bit line in the cell array region and a peripheral gate in the peripheral circuit region by patterning the second wiring film, the bit line contact, the etching buffer film, and the first wiring film,
the patterning the second wiring film and the bit line contact is performed so as to prevent the first wiring film from being etched by the etching buffer film.

8. A method of forming a semiconductor device, comprising:
providing a substrate having a peripheral circuit region and a cell array region, the cell array region having a source/drain region;
forming a lower wiring structure and an etching buffer structure over the peripheral circuit region and the cell array region;
forming a bit line contact extending through the etching buffer structure and the lower wiring structure to the source/drain region;
forming an upper wiring structure over the peripheral circuit region and the bit line contact; and
forming a bit line in the cell array region and a peripheral gate in the peripheral circuit region by simultaneously patterning the upper wiring structure, the bit line contact, the etching buffer structure, and the lower wiring structure.

9. The method of claim 8, wherein the forming the upper wiring structure over the peripheral circuit region and the bit line contact includes partially exposing the etching buffer structure in the peripheral region and the cell array region.

10. The method of claim 8, further comprising:
forming an ohmic barrier pattern over the peripheral region and the cell array region using the etching buffer structure as an etch buffer, prior to the forming a bit line.

11. The method of claim 10, wherein the etching buffer structure has at least one selected from (i) a higher etching selectivity and (ii) a smaller thickness than the ohmic barrier pattern.

12. The method of claim 10, wherein
the etching buffer structure is formed of at least one lanthanoid, and
the ohmic barrier pattern is formed of at least one metal silicide.

* * * * *